United States Patent [19]

Ohtani et al.

[11] Patent Number: 4,977,441
[45] Date of Patent: Dec. 11, 1990

[54] SEMICONDUCTOR DEVICE AND TAPE CARRIER

[75] Inventors: Hideya Ohtani, Aichi; Toshimitsu Momoi, Higashimurayama; Eiji Ooi, Kawagoe; Shuhei Sakuraba, Kodaira; Masayuki Morita, Nishitama; Yoshiaki Wakashima, Kawasaki, all of Japan

[73] Assignee: Hitachi, Ltd., Tokyo, Japan

[21] Appl. No.: 515,344

[22] Filed: Apr. 30, 1990

Related U.S. Application Data

[60] Continuation of Ser. No. 247,636, Sep. 22, 1988, abandoned, which is a division of Ser. No. 946,951, Dec. 29, 1986, abandoned.

[51] Int. Cl.⁵ .................... H01L 23/48; H01L 29/40
[52] U.S. Cl. ............................. 357/70; 357/45; 357/71
[58] Field of Search ............................ 357/45, 71, 70

[56] References Cited

U.S. PATENT DOCUMENTS

| | | | |
|---|---|---|---|
| 4,499,484 | 2/1985 | Tamzawa et al. | 367/45 |
| 4,635,092 | 1/1987 | Yerman et al. | 357/70 |
| 4,701,781 | 10/1987 | Sankhagowit | 357/70 |
| 4,742,431 | 5/1988 | Igarashi | 357/70 |

Primary Examiner—Jerome Jackson, Jr.
Attorney, Agent, or Firm—Antonelli, Terry, Stout & Kraus

[57] ABSTRACT

According to the present invention, a tape carrier is prepared which comprises a power trunk line including an electric connection as a branch of a power lead for each tape carrier unit and a ground trunk line having an electric connection as a branch of a ground lead for each tape carrier unit, the power and trunk lines being continuously formed along the longitudinal direction of the tape carrier, and a lead for a control signal for establishing an electric conduction along the longitudinal direction of the tape carrier via an aging wiring for semiconductor pellets to conduct a simultaneous multipoint (gang) bonding on the tape carrier, the control signal lead being formed on the tape carrier. By mounting the semiconductor pellets having the aging wiring on the tape carrier, it is enabled to apply the power voltage and to supply the control signal to each of the plurality of the semiconductor pellets, and hence the operation test can be simultaneously conducted for the semiconductor pellets mounted on the tape carrier having an arbitrary length. This provision enables a plurality of semiconductor devices mounted on the tape carrier to be subjected to an aging, namely, a reliability test under a thermal environment and in the operating state, and hence an efficient reliability test can be achieved with an effect of the mass production. Consequently, a highly reliable semiconductor device can be provided.

27 Claims, 3 Drawing Sheets

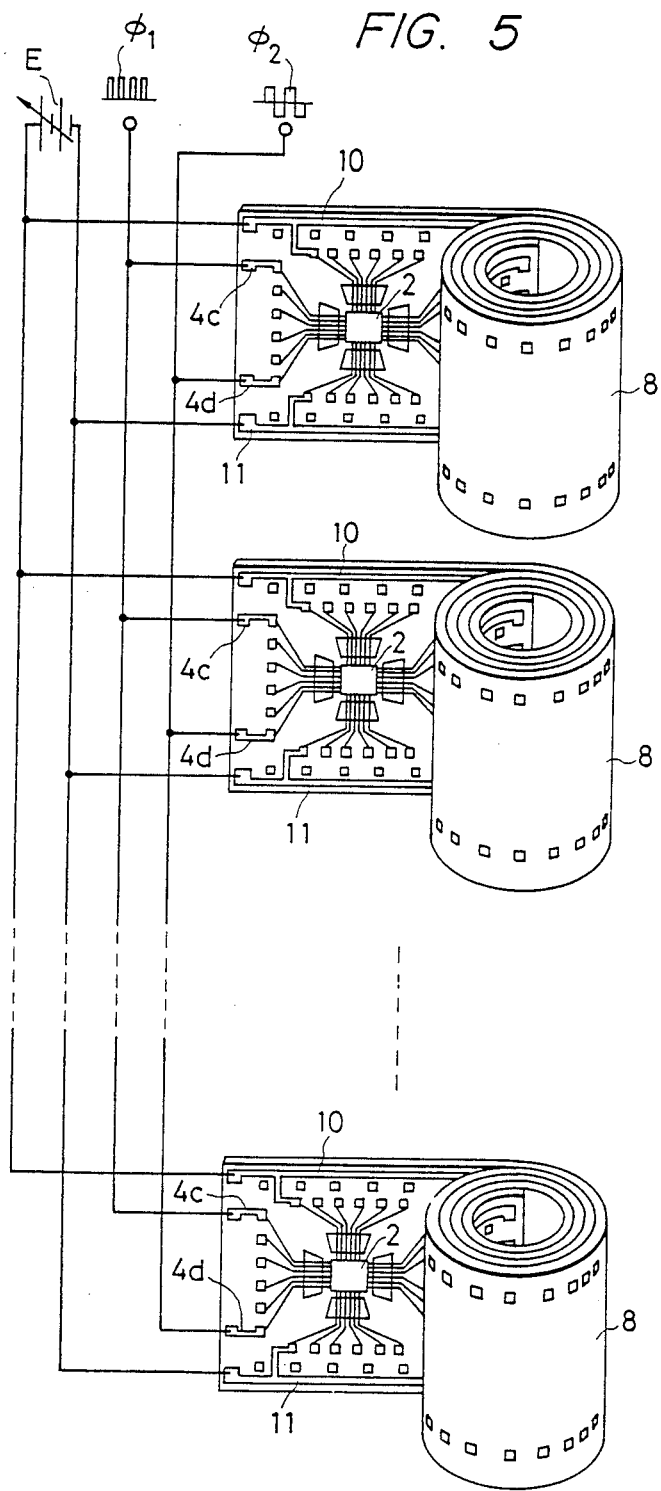

SEMICONDUCTOR DEVICE AND TAPE CARRIER

This application is a continuation of application Ser. No. 07/247,636, filed on Sept. 22, 1988, which is a divisional application of application Ser. No. 946,951, filed Dec. 29, 1986, both abandoned.

BACKGROUND OF THE INVENTION

The present invention relates to a semiconductor device and a process for producing the same, and a tape carrier used in the process.

Among the various types of semiconductors, there are semiconductors produced according to a so-called tape carrier system. Such a semiconductor device is produced by use of a tape carrier, with techniques such as a wire bonding, the tape carrier having a plurality of leads (wiring pattern) with a predetermined shape formed thereon by use of, for example, a copper foil. The tape carrier is made of a tape (film) manufactured by use of an insulating material such as polyimide. Namely, an electrode of a semiconductor pellet in which an integrated circuit (IC) or a large-scale integrated circuit (LSI) is formed is bonded to an end of the lead by use of a simultaneous, multipoint bonding, namely, by the gang bonding, and thereafter the other end of the lead is cut off and is linked to a wiring electrode of a wiring board such as a printed circuit board, thereby manufacturing the semiconductor device.

The tape carrier is of a long size including a plurality of tape carrier units each formed by locating a lead pattern corresponding to an external lead of a semiconductor pellet on a tape manufactured by use of an insulation material. With the semiconductor pellet being bonded to the tape carrier unit, the tape carrier can be wound up on a reel for storage. As a consequence, semiconductor devices using the tape carrier system are quite suitable for automation, for the production of semiconductor devices for e.g., watches and calculators, namely, so-called chip-on-board type semiconductor devices.

Incidentally, the tape carrier system is described in "IC JISSO GIJUTSU (IC PLACEMENT TECHNOLOGY)", Japan Electronics Association; K. K. Kogyo Chosa Kai, Jan. 14, 1980 (page 107 and subsequent pages).

SUMMARY OF THE INVENTION

A higher reliability is required for semiconductor devices. To this end, aging testing is used as a reliability test. In the aging test, a semiconductor device is subjected to an electrical operation under a state where the device is heated.

However, the tape carrier system has a difficulty that the aging test of a semiconductor device cannot be easily accomplished. The inventor of the present invention has found that the problem is particularly considerable for a semiconductor which does not operate unless a power supply voltage associated with the electrical operation test is applied and a control signal is further supplied thereto.

The problem will be described in detail hereinbelow.

In a semiconductor device produced according to the tape carrier system, the leads thereof are formed from a copper foil having a thickness of about 35 μm, and is hence soft and easy to deform. Consequently, the handling of the leads for each semiconductor is difficult, namely, cannot be easily effected. This is because such a semiconductor device produced according to the tape carrier system is compact; and hence a great difficulty appears when manually transporting the device or when mounting the device in a tester for the device test. Also in the aging test, the handling of the compact semiconductor device having the leads of the tape carrier system is considerable difficult. Moreover, it is practically almost impossible in some cases to attach a terminal for the operation test to the thin-film lead, which is soft and easy to deform, and to perform for each compact semiconductor device an efficient aging test under a uniform, proper condition when a great number of such devices are to be tested.

Consequently, the operation test under a thermal environmental condition has not been conventionally accomplished hitherto, which makes it quite difficult to correctly detect a defective device or a semiconductor device having a latent defect.

It is therefore an object of the present invention to provide a semiconductor device for which an operation test under a thermal environment can be efficiently achieved.

Another object of the present invention is to provide a semiconductor device for which a large-quantity test can be efficiently accomplished.

Another object of the present invention is to provide a semiconductor device which has, after passing an appropriate test, a high reliability.

Still another object of the present invention is to provide a method for producing a semiconductor device for which a large-quantity test can be efficiently achieved.

Another object of the present invention is to provide a tape carrier capable of effectively accomplishing a large-quantity operation test.

Further another object of the present invention is to provide a technology enabling an aging of a semiconductor pellet for a tape carrier type semiconductor device.

These and other objects and the novel features of the present invention will be apparent from the following detailed description taken in conjunction with the accompanying drawings.

The representative features of the invention disclosed in this application can be briefly described as follows.

That is, a tape carrier is prepared which comprises (1) a power trunk line including an electric connection as a branch of a power lead for each tape carrier unit, and (2) a ground trunk line having an electric connection as a branch of a ground lead for each tape carrier unit, the power and ground trunk lines being continuously formed along the longitudinal direction of the tape carrier; and which also comprises a lead for a control signal for establishing electric conduction along the longitudinal direction of the tape carrier, via an aging wiring for semiconductor pellets, to effect a simultaneous multipoint bonding on the tape carrier, the control signal lead being formed on the tape carrier. By mounting the semiconductor pellets having the aging wiring on the tape carrier, it is possible to apply the power voltage and to supply the control signal to each of the plurality of the semiconductor pellets, and hence the operation test can be simultaneously conducted for the semiconductor pellets mounted on the tape carrier having an arbitrary length. This provision enables a plurality of semiconductor devices mounted on the tape carrier to be subjected to an aging, namely, a reliability test under a thermal environment and in the operating state, and hence an efficient reliability test can be achieved with an increased effect of the mass production. Consequently, a highly reliable semiconductor device can be provided.

BRIEF DESCRIPTION OF THE DRAWINGS

The present invention will be apparent from the following detailed description taken in conjunction with the accompanying drawings in which:

FIG. 5 is a schematic explanatory diagram demonstrating an aging of the semiconductor pellet.

DESCRIPTION OF THE PREFERRED EMBODIMENTS

Figure 1:
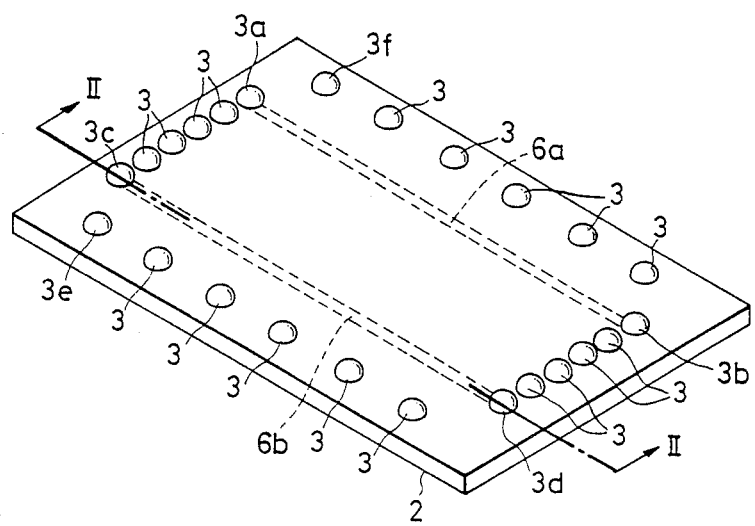
FIG. 1 is a perspective view of a semiconductor pellet incorporated into a semiconductor device as an embodiment of the present invention.
Figure 2:
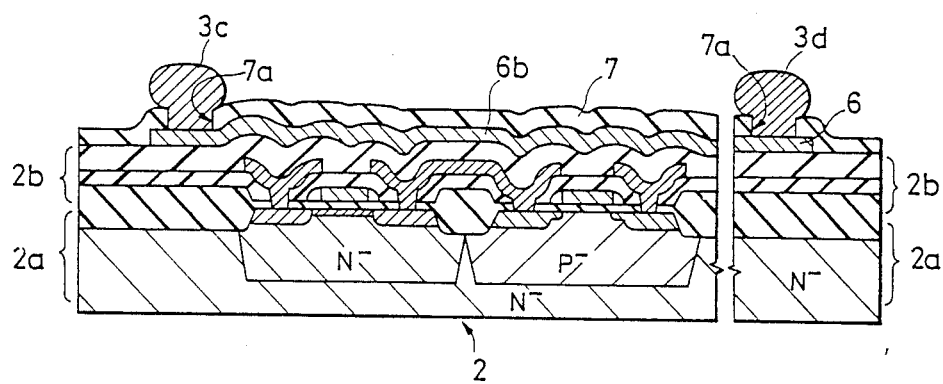
FIG. 2 is an enlarged cross-sectional view along a line II—II of the semiconductor pellet.
Figure 3:
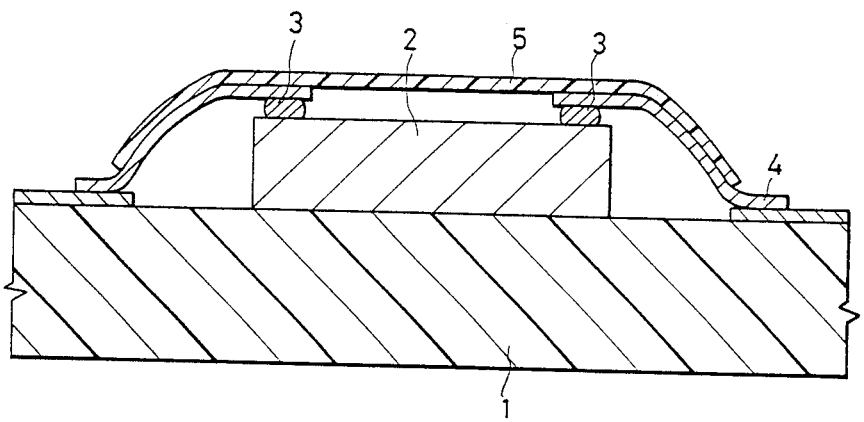
FIG. 3 is a schematic cross-sectional diagram showing a portion of the semiconductor device as the embodiment.
Figure 4:
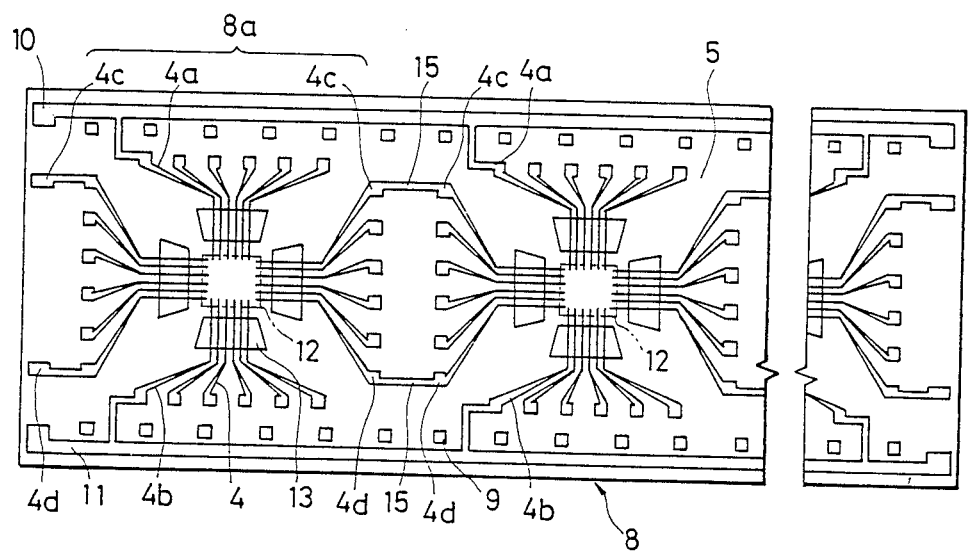
FIG. 4 is a plan view illustrating an outline of a tape carrier applied to the production of the semiconductor device as the embodiment.

FIG. 1 is a perspective view of the semiconductor pellet incorporated into the semiconductor device as an embodiment of the present invention, FIG. 2 is a cross-sectional view along a line II—II of the semiconductor pellet, and FIG. 3 is a cross-sectional diagram showing a portion of the semiconductor device as the embodiment. Furthermore, FIG. 4 is a plan view illustrating a tape carrier applied to the production of the semiconductor device as the embodiment, whereas FIG. 5 is an explanatory diagram demonstrating an aging of the semiconductor pellet.

The semiconductor device of the embodiment is of a chip-on-board (COB) type. That is, referring to FIG. 3, a semiconductor pellet 2 is mounted on a wiring board 1 comprising a printed circuit board with the face of the pellet 2 up (in the face-up state), and an electrode pad 3 of the semiconductor pellet 2 is electrically connected via a lead 4 to an electrode, the lead 4 being formed with a copper foil having a thickness of about 35 μm. A polyimide film 5 is fixed to a portion of the lead 4.

In the semiconductor pellet 2 incorporated into the semiconductor device by use of the simultaneous multipoint bonding (gang bonding), a wiring 6 including a wiring 6a and a wiring 6b is formed between electric pads 3a and 3b and between electric pads 3c and 3d formed along two opposing edges of a plurality of electric pads 3 as shown in FIG. 1. The wirings 6a and 6b are utilized as the aging wirings in this embodiment.

FIG. 2 is a cross-sectional diagram illustrating the relationships between the electric pads 3c–3d and the aging wiring 6b. The aging wirings 6a and 6b are formed, like the ordinary internal wiring, of aluminum (Al) disposed beneath a passivation layer, and the electric pad 3 is formed to protrude into a hole portion 7a in the passivation layer. The electric pad 3 is of a bump electrode structure and can be formed, for example, in a 3-layer structure in which chromium (Cr), copper (Cu), and gold (Au) are sequentially fixed onto the aging wirings 6a and 6b. The wirings 6a and 6b may be configured in various structures. The wirings 6a and 6b may be simultaneously formed when manufacturing the multilayer wiring of the semiconductor pellet or may be formed in the different processes. If the wirings 6a and 6b are simultaneously formed together with the multilayer wiring, the multilayer internal wiring of two or three layers may be used for the formation of the aging wirings. The material of the wirings may be aluminum, polycrystalline silicon having a low resistance, or a refractory metal layer.

The semiconductor device of the present embodiment is produced by use of the tape carrier of FIG. 4. The tape carrier 8 includes as a base a longitudinal polyimide film 5 on which a plurality of tape carrier units 8a, having a predetermined lead pattern to be applied to a semiconductor pellet, are continuously formed in the direction to the right side of the diagram, the tape carrier 8 further including a wiring pattern formed thereon. On both sides in the transverse direction of the tape carrier 8, there are formed feed holes 9 with a fixed pitch along the entire film 5.

Moreover, in the film 5 located outside of the feed holes 9, a power trunk wiring 10 and a ground trunk wiring 11 are linearly and continuously formed along the longitudinal direction in the intermediate and lower sections of the diagram, respectively.

A semiconductor pellet mount section 12 is disposed at a central portion of the tape carrier unit 8a, and a plurality of leads 4 each having an internal end are arranged in a predetermined shape on an internal periphery of the mount section 12. In addition, four through-holes 13 are disposed on the external periphery of the mount section 12 so as to enclose the mount section 12, and each lead 4 is bridged across the holes 13.

Among the leads 4 extending from the mount section 12, the power lead 4a is branched from the power trunk line 10 and these components are formed in a unit as an electric wiring.

Moreover, among the leads 4 extending from the mount section 12, the ground lead 4b is branched from the ground trunk line 11 and these components are formed in a unit as an electric wiring. Consequently, when the semiconductor pellet 2 is fixed by use of the gang bonding on the chip carrier 8, the internal ends of the power lead 4a and the ground lead 4b, respectively can be fixed to the power electrode pad 3e and the ground electrode pad 3f of the semiconductor pellet 2, respectively. As a result, when a power supply E (e.g. see FIG. 5) is installed between the power trunk line and the ground trunk line 11 to apply a predetermined test voltage, the power voltage can be applied to all semiconductor pellets mounted on the tape carrier 8.

In addition, among the leads 4 arranged on the right and left sides of the mount section 12 for the tape carrier unit 8a, two leads located at the top and bottom are used as the control signal leads 4c and 4d. The other leads 4 are electrically disconnected between the adjacent tape carrier units, whereas the control signal leads 4c and 4d are electrically connected by use of a connection wiring 15 between the adjacent tape carrier units.

Since the semiconductor pellets 2 are fixed on the tape carrier 8 by the bonding, namely, the tape carrier leads 4 and the pad electrodes 3 of the semiconductor pellet are subjected to the gang bonding, the internal end of the control signal lead 4c and the internal end of the lead 4d can be fixed to the electric pad 3c or 3d and the electric pad 3a or 3b, respectively for each tape carrier unit 8. As a consequence, the control signal leads 4c and 4d formed in the tape carrier unit 8a are electrically connected between the tape carrier units through the aging wirings 6a and 6b formed on the semiconductor pellet 2. As a result, by using the semiconductor pellet of the present invention also for the control signal lead, the electric conduction is established through the entire tape carrier 8. Consequently, when the control signals φ1 and φ2 are applied to the control signal leads 4c and 4d, respectively, the operation test can be conducted in a state where the control signals are simultaneously applied to the semiconductor pellets mounted over the tape carrier 8. The aging wirings 6a and 6b can be subjected to a disconnect processing if necessary.

As described above, since the semiconductor pellets 2 are mounted on the tape carrier 8, the power voltage E can be applied to all the semiconductor pellets 2 on the overall tape carrier 8, thereby effecting the conduction test with the control signals φ1 and φ2 being supplied thereto. As shown in FIG. 5, therefore, the conduction test can be achieved so that a plurality of pellets are simultaneously subjected to the aging, by installing a plurality of tape carriers, each being rolled up as a volume in a compact state, into a thermostatic bath.

The semiconductor device of the embodiment is produced as follows. First of all, a silicon wafer in the shape of a wafer is processed through thermal diffusion, oxide film creation, and CVD film creation so as to form a semiconductor IC 2a and a multilayer wiring layer 2b containing aging wirings. And then a probe test is conducted on the wafer to determine whether or not the aging wirings are acceptable. Next, the wafer is divided by dicing process to obtain semiconductor pellets. Thereafter, aging is performed for the tape carrier 8 on which the semiconductor pellets 2 are fixed by the gang bonding, and then a probe test is executed for each tape carrier unit 8a to select acceptable products. For the tape carrier unit 8a on which an acceptable semiconductor pellet is mounted, the lead 4 is cut off at a position of the hole 13 disposed in the film of FIG. 4. The unnecessary portion of the tape carrier is then removed, thereby obtaining an acceptable product in which the semiconductor pellet 2 and the lead 4 fixed thereto are formed in a unit. Thereafter, a top end of the lead 4 fixed to the separated semiconductor pellet 2 is bonded with the electrode of the wiring board 1, thereby completing the production of the semiconductor.

Since the semiconductor device of this embodiment thus produced includes a semiconductor pellet 2 that has undergone such a sufficient aging as described above and then mounted on the device, a quite high reliability can be developed without any defects remaining in the semiconductor device.

In addition, with the tape carrier 8, the probe test can be conducted on the semiconductor pellet 2 of each tape carrier unit 8a while executing the aging process on the semiconductor pellet 2 or immediately after the aging if the control signal leads 4c and 4d of the adjacent tape carrier unit are cut off at the connecting portion 15. Consequently, a latent defect, which is restored to the normal state when the product is left to stand for a certain period of time after the aging is conducted and which cannot be therefore detected, can be effectively detected because the probe test is achieved immediately after the aging is conducted.

As an aging method, a portion of the tape carrier can be cut away to provide semiconductor pellets on separated portions; and for the semiconductor pellet 2 mounted on a separated portion, the electric connections such as for the power supply, grounding potential, and control signals can be established for each aging process. Such troublesome procedures are not required when the tape carrier 8 of the embodiment is used. Since the simultaneous aging is possible for all the semiconductor pellets over the entire tape carrier 8, the long-period and large-quantity aging is enabled during the same processing time, as compared with the case described above. Consequently, the reliability of the semiconductor device can be greatly improved.

Although the present invention has been concretely described with reference to an embodiment of the present invention, it is not restricted by the embodiment. The embodiment can be modified in various fashions without departing from the scope and spirit of the present invention.

As the test wiring 6 to be formed simultaneously with the creation of the multilayer wiring layer 2b of the semiconductor pellet 2 or in a separate process, it is only required to dispose a wiring structure establishing a short circuit between the control signal pad electrodes 3a and 3b or between the electrodes 3c and 3d. As a consequence, a jumper wire other than the wirings associated with the multilayer wiring layer may be used for the short-circuit wiring between the pads. This jumper wire has an effect that the operation to disconnect the wire when necessary is facilitated.

For example, although the power trunk line and the ground trunk line are formed in the marginal film region outside the feed holes, they are not restricted by this configuration, namely, the other marginal portion of the film region may also be used.

Moreover, the tape carrier includes two control signal leads located at the top and the bottom of the diagram; however, the number of the control signal leads, the locations for the leads, and the shape pattern are not restricted by the embodiment. Consequently, the aging wirings of the semiconductor pellets to which the control signal leads are connected are similarly not restricted by the embodiment.

Furthermore, the shape of the film for each tape carrier unit and the lead pattern formed thereon are naturally not restricted by the embodiment.

The description of the invention has been made with reference to the utilization field as the background of the invention mainly realized by the inventors, namely, to a case where the invention is applied to the so-called COB-type semiconductor; however, the present invention is not restricted by this case but it is a technology which can also be applied to any semiconductor device using the tape carrier system for the production thereof, regardless of the external shape of the package or the like.

As noted previously, in recent semiconductor devices, higher reliability is required. To this end, aging is performed as a reliability test in which a semiconductor device is subjected to an electrical operation state under a state where the device is heated.

According to the present invention, even for the semiconductor device associated with the tape carrier system, the aging of the semiconductor device can be easily performed, and hence the electrical operation test in which the power voltage is applied to the device and further the control signals are applied thereto can be achieved as the aging for the semiconductor device in the ordinary operating state.

In addition, according to the present invention, a plurality of semiconductor pellets on a tape carrier can be subjected to various tests, such as the aging test and the operation test under a thermal environment, in a state where each semiconductor pellet is not manually handled. Consequently, the semiconductor device of the present invention, namely, the Tape Automated Bonding (TAB) product, can be subjected to large-quantity tests which have been conventionally difficult to be automatically achieved without any human intervention, which enables the test processes to be carried out quite efficiently.

The semiconductor device of the present invention allows the operation test to be efficiently accomplished under a thermal environment.

The semiconductor device of the present invention enables the large-quantity test to be efficiently achieved.

According to the present invention, there is provided a highly reliable semiconductor device after a proper test is finished.

According to the present invention, there is provided a method for manufacturing a semiconductor device capable of efficiently conducting the large-quantity test.

According to the present invention, there is provided a tape carrier capable of efficiently accomplishing the large-quantity test.

The effect of the present invention is as follows.

(1) A tape carrier is prepared which comprises a power trunk line including an electric connection as a branch of a power lead for each tape carrier unit and a ground trunk line having an electric connection as a branch of a ground lead for each tape carrier, the power and trunk lines being continuously formed along the longitudinal direction: and a lead for a control signal for establishing an electric conduction along the longitudinal direction via an aging wiring for semiconductor pellets to be mounted. By mounting the semiconductor pellets having the aging wiring on the tape carrier, it is possible to apply the power voltage and to supply the control signal to each of the plurality of the semiconductor pellets, and hence the conduction (operation) test can be simultaneously conducted for the semiconductor pellets mounted on the tape carrier having an arbitrary length.

(2) The operation (conduction) test is conducted by heating the device to a predetermined temperature, and hence the aging can be simultaneously effected for all semiconductor pellets mounted on the tape carrier having an arbitrary length.

(3) Since the aging can be simultaneously conducted for a great quantity of semiconductor pellets according to (2) above, the large-quantity test can be efficiently achieved within a predetermined period of time, thereby lowering the cost of the tape carrier type semiconductor device.

(4) For the similar reason to that of (3) above, the large-quantity test can be efficiently effected and the aging can be achieved for a plurality of semiconductor pellets in the compact state; as a result, long-time aging is possible and the reliability of the semiconductor device is improved. Incidentally, it is noted that the actual aging time for "long-time aging" depends on the particular circumstances and device requirements and can vary extensively. For example, a typical range would be from as short a time as two hours to as long a time as 20 days.

(5) According to (2) above, by disconnecting the control signal lead between the adjacent tape carrier units during or immediately after the aging on a semiconductor pellet, the probe check can be executed on the semiconductor pellet for each tape carrier unit immediately after the aging. Consequently, a defect which is restored with a lapse of time can be detected by the probe check, and hence a highly-reliable semiconductor device can be provided for the user.

(6) Based on (1)-(5) above, a low-priced tape carrier type semiconductor device having a high reliability can be supplied to the user.

What is claimed is:

1. A tape carrier for a semiconductor device comprising:
    (a) an insulation tape having a longitudinal shape on which a plurality of tape carrier units are provided, each tape carrier unit having a wiring pattern with a plurality of leads, the tape carrier units being uniformly spaced along a length of the tape, the length being in the direction of the longitudinal shape, the plurality of leads including control signal leads, the control signal leads of adjacent tape carrier units being electrically connected by conductive lines; and
    (b) at least one trunk lead disposed along the entire length of the tape, with a plurality of branched leads branched from the at least one trunk lead, a respective branched lead of the plurality of branched leads being electrically connected to a lead of a corresponding tape carrier unit.

2. A tape carrier according to claim 1 wherein the control signal leads and conductive lines extend between adjacent tape carrier units, in the direction of the longitudinal shape.

3. A semiconductor device according to claim 1, wherein the tape carrier has opposed sides extending in the direction of the longitudinal shape, and wherein the at least one trunk lead is disposed adjacent at least one of the opposed sides of the tape carrier.

4. A semiconductor device according to claim 1, wherein the tape carrier has opposed sides extending in the direction of the longitudinal shape, with edges of the tape carrier forming boundaries for the respective opposed sides, wherein the device further includes feed holes at both sides of the tape carrier, in the direction of the longitudinal shape, and wherein the at least one trunk lead is disposed in the direction of the longitudinal shape at least one of the sides of the tape carrier, between a respective edge forming a boundary thereof and the feed holes thereof.

5. A tape carrier according to claim 1 wherein the at least one trunk lead includes a power wiring trunk lead and a ground wiring trunk lead.

6. A tape carrier according to claim 1 wherein said insulation tape is made of a polyimide film.

7. A tape carrier according to claim 1 wherein said wiring pattern is made of a copper foil.

8. A semiconductor device comprising:
    (a) a tape carrier, including an insulation tape having a longitudinal shape on which a plurality of tape carrier units are provided, each tape carrier unit having a wiring pattern with a plurality of leads, the plurality of leads including control signal leads;
    (b) the control signal leads of adjacent tape carrier units being electrically connected via conductive lines;
    (c) at least one trunk lead being continuously disposed along an entire length of the tape so as to be connected to the plurality of tape carrier units, in the direction of the longitudinal shape, with a plurality of branched leads branched from the trunk lead and electrically connected respectively to a lead of a corresponding tape carrier unit; and (d) a plurality of semiconductor pellets, respectively for the plurality of tape carrier units, each pellet having a surface with opposed sides, having at least one control signal pad electrode in the vicinity of one side of each semiconductor pellet and at least one control signal pad electrode in the vicinity of the side opposing said one side, and having at least one wiring layer for electrically connecting between said control signal pad electrodes at opposed sides of said semiconductor pellet; wherein said control signal pad electrodes and said control signal leads are bonded respectively, and wherein said tape carrier units provided on said tape carrier are electrically connected with each other through said control signal leads and said at least one trunk lead.

9. A semiconductor device according to claim 8, wherein the semiconductor pellets each have a plurality of pad electrodes, the plurality of pad electrodes being respectively bonded to the plurality of leads of a corresponding tape carrier unit by a wireless simultaneous multipoint bonding.

10. A semiconductor device according to claim 8 wherein the at least one trunk lead includes a power trunk lead and a ground trunk lead.

11. A semiconductor device according to claim 8, further comprising a plurality of connection wirings, the connection wirings being provided on the insulation tape so as to electrically connect control signal pad electrodes of semiconductor pellets of adjacent tape carrier units, thereby providing electrical connection of control signal leads of adjacent tape carrier units.

12. A semiconductor device according to claim 11 wherein the plurality of connection wirings extend so as to electrically connect control signal pad electrodes of semiconductor pellets of adjacent tape carrier units along the entire length of the tape, so as to electrically connect in series the control signal pad electrodes of the semiconductor pellets along the length of the tape.

13. A semiconductor device according to claim 8 wherein each semiconductor pellet includes a plurality of control signal pad electrodes in the vicinity of one side of the semiconductor pellet and a plurality of control signal pad electrodes in the vicinity of the other side opposing said one side, with wiring layers respectively being provided between the control signal pad electrodes at opposed sides of said semiconductor pellet.

14. A semiconductor device according to claim 13 wherein the wiring layers are layers formed of a same material as multilayer wiring of the semiconductor pellets.

15. A semiconductor device according to claim 14, wherein the wiring layers are layers formed simultaneously with the multilayer wiring of the semiconductor pellets.

16. A semiconductor device according to claim 1 wherein the at least one wiring layer is at least one layer formed of a same material as multilayer wiring of the semiconductor pellets.

17. A semiconductor device according to claim 16 wherein the at least one wiring layer is formed simultaneously with the multilayer wiring of the semiconductor pellets.

18. A semiconductor device according to claim 8 wherein each of the at least one trunk leads is linearly disposed.

19. A semiconductor device according to claim 8 wherein the tape carrier units are uniformly spaced from each other along a length of the tape.

20. A semiconductor device according to claim 8 wherein each semiconductor pellet is provided for a respective tape carrier unit at a central zone of the respective tape carrier unit.

21. A semiconductor device according to claim 8 wherein the at least one wiring layer, extending between said control signal pad electrodes at opposed sides of said semiconductor pellet, extends in a lengthwise direction of the longitudinal shape.

22. A semiconductor device according to claim 8 wherein a line between the opposed sides of each semiconductor pellet, having the control signal pad electrodes in the vicinity thereof, extends in a lengthwise direction of the longitudinal shape.

23. A semiconductor device according to claim 8, wherein the tape carrier has opposed sides extending in the direction of the longitudinal shape, and wherein the at least one trunk lead is disposed adjacent at least one of the opposed sides of the tape carrier.

24. A semiconductor device according to claim 8, wherein the tape carrier has opposed sides extending in the direction of the longitudinal shape, with edges of the tape carrier forming boundaries for the respective opposed sides, wherein the device further includes feed holes at both sides of the tape carrier, in the direction of the longitudinal shape, and wherein the at least one trunk lead is disposed in the direction of the longitudinal shape at least one of the sides of the tape carrier, between a respective edge forming a boundary thereof and the feed holes thereof.

25. A semiconductor device according to claim 10, wherein the tape carrier has opposed sides extending in the direction of the longitudinal shape, and wherein the power trunk lead extends along one of the opposed sides of the tape carrier and the ground trunk lead extends along the other of the opposed sides of the tape carrier.

26. A semiconductor device according to claim 7, wherein said semiconductor pellets each have an integrated circuit.

27. A semiconductor device according to claim 7 wherein said plurality of semiconductor pellets each include a power input pad electrode and a ground connection pad electrode.

* * * * *